United States Patent [19]
Lohrmann

[11] 3,949,246
[45] Apr. 6, 1976

[54] PIEZOELECTRIC BIMORPH CONTROLLED VARIABLE CAPACITOR

[75] Inventor: Dieter R. Lohrmann, Eatontown, N.J.

[73] Assignee: The United States of America as represented by the Secretary of the Army, Washington, D.C.

[22] Filed: Dec. 23, 1974

[21] Appl. No.: 535,239

[52] U.S. Cl. ................. 310/8.6; 310/9.1; 310/8.3; 310/9.8; 317/249 R
[51] Int. Cl. ........................................... H01l 41/08
[58] Field of Search .............. 310/8.3, 8.5, 8.6, 9.1, 310/9.4, 8.1; 317/144, 249 R, 250, 246

[56] References Cited
UNITED STATES PATENTS

| | | | |
|---|---|---|---|
| 2,289,183 | 7/1942 | Ehret et al. | 310/8.1 X |
| 2,714,642 | 8/1955 | Kinsley | 317/144 |
| 3,166,696 | 1/1965 | Furman | 310/8.1 |
| 3,290,595 | 12/1966 | Novotny | 310/8.1 X |
| 3,646,413 | 2/1972 | Oomen | 310/8.6 X |

Primary Examiner—Mark O. Budd
Attorney, Agent, or Firm—Nathan Edelberg; Robert P. Gibson; Jeremiah G. Murray

[57] ABSTRACT

This invention relates to a remotely controlled variable capacitor, more particularly, to an electromechanical capacitor with one of the capacitor electrodes mounted on one surface of a bimorph element and the other capacitor electrode mounted on the surface of a superimposed bimorph element. In response to a DC electrical signal, there is a mechanical motion separating the capacitor electrodes to vary the capacitance therebetween.

2 Claims, 2 Drawing Figures

PIEZOELECTRIC BIMORPH CONTROLLED VARIABLE CAPACITOR

BACKGROUND OF THE INVENTION

1. Field of the Invention

A remotely controlled variable capacitor has many uses in the electronic circuitry and a remotely controlled unit is needed in many places where direct mechanical tuning is impossible. For example, in the matching of the impedance of a whip antenna to the output of a transmitter at various frequencies, particularly in pack sets, a variable control element, like an electrically tunable capacitor or inductor, is necessary. However, for use in a portable set, this element must be small, lightweight and consume very little battery power. It should also have linear characteristics so as to be able to handle the radio frequency output power of the transmitter without additional distortion and, of course, it must be reasonably inexpensive.

2. Description of the Prior Art

One type of remotely controlled variable capacitor is the Varactor Diode which is a semiconductor junction device whose capacity varies with the back biased voltage applied. This device is nonlinear and causes the transmitter current to create additional spurious signals, especially harmonics, due to the nonlinearity.

Another type of remotely controlled variable capacitor is the Ferroelectric Barium Titanate Capacitor, wherein the capacity varies with the DC voltage applied. However, their narrow temperature range prohibits use in rugged, pack set radios.

Impedance matching may also be accomplished with variable inductors or saturable reactors such as "Vari-L" or "increductor" wherein the inductance of a coil is changed by magnetizing its core with a magnetic field to vary its permeability. This magnetic field is normally created by an electromagnet which requires direct current power and is comparatively heavy. A permanent magnet may also be used but its field must still be varied by a secondary electromagnetic field controlled by a direct current. In any case, the device is comparatively big and cumbersome and is not optimum for use with portable pack set radios.

SUMMARY OF THE INVENTION

The object of the present invention is to provide a remotely controlled variable capacitor that has none of the above described disadvantages.

Another object is to provide a tunable variable capacitor used where mechanical tuning is impossible. The instant invention comprises a first and second disc shaped bimorph element with conductive surfaces. A portion of the conductive surface is etched away to allow deposition of capacitor plates on the first and second disc shaped bimorph elements. The first and second bimorph elements with two capacitor electrodes are superimposed and are sealed at their joined perimeter.

DESCRIPTION OF THE PREFERRED EMBODIMENT

Figure 1:
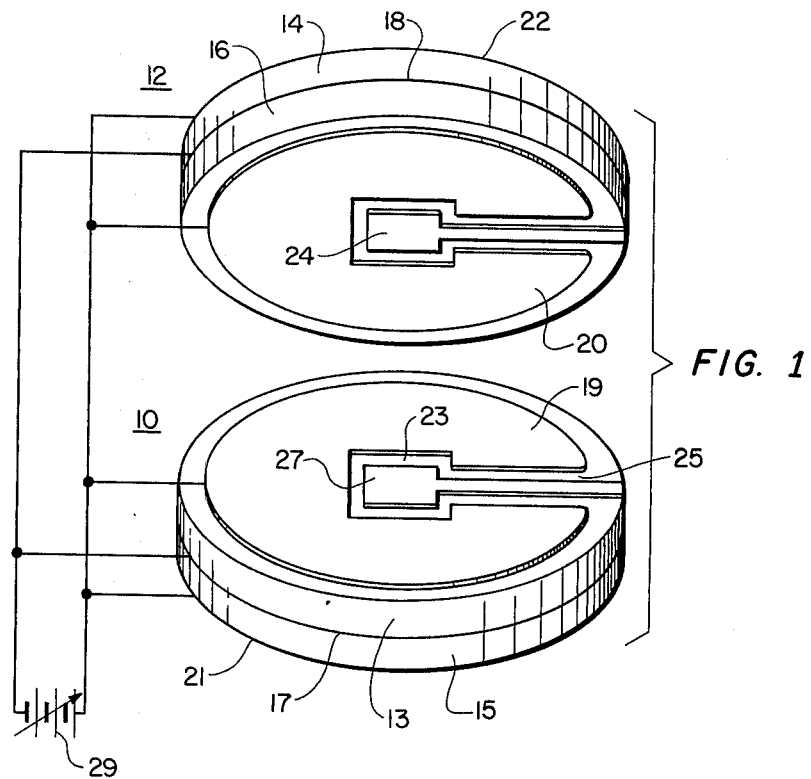
FIG. 1 is an exploded perspective view of a disc shaped bimorph element.

Referring now to FIG. 1, there is shown two disc shaped bimorph elements, 10 and 12, both formed by bonding together two piezoelectric crystalline plates of different polarizations as is well known in the art. In bimorph element 10, the bonded piezoelectric crystalline plates 13 and 15 have a contiguous surface 17, and the other surfaces are provided with electrically conductive layers 19 and 21 respectively. The conductive layer 19 has a surface portion etched away to provide a rectangular area 23 at the center of the crystalline plate 13. A relatively narrow channel-like portion 25 is similarly etched away and extends from area 23 to the periphery of the piezoelectric plate 13. Deposited by a vapor deposition within the rectangular area 23 and channel 25 of piezoelectric plate 13 is a capacitor electrode 27 having the same shape as the etched region but of lesser dimension so as to provide an insulated spacing from the conductive surface layer 19. A DC source of potential 29 is applied to the disc shaped bimorph element 10, such that the conductive surfaces of the piezoelectric plate 19 and 21 are connected to the positive terminal of potential source 29. The negative or ground terminal of the potential source of 29 is applied to the interface of the piezoelectric plates 13 and 15 at 17.

The disc shaped bimorph element 12 is a mirror image of bimorph element 10. Piezoelectric cyrstalline plates 14 and 16 have conductive layers 20 and 22 deposited on their distal surfaces. The deposition and formation of capacitor electrode 24 on piezoelectric plate 16 is in all manner identical with the formation of capacitor electrode 27 on piezoelectric plate 13 so that both electrodes are the same size and shape. The exposed surfaces of the capacitor electrodes 24 and 27 are anodized to form insulated layers so that when bimorphs 10 and 12 are superimposed, the capacitor electrodes 24 and 27, when in contact, do not short circuit.

Figure 2:
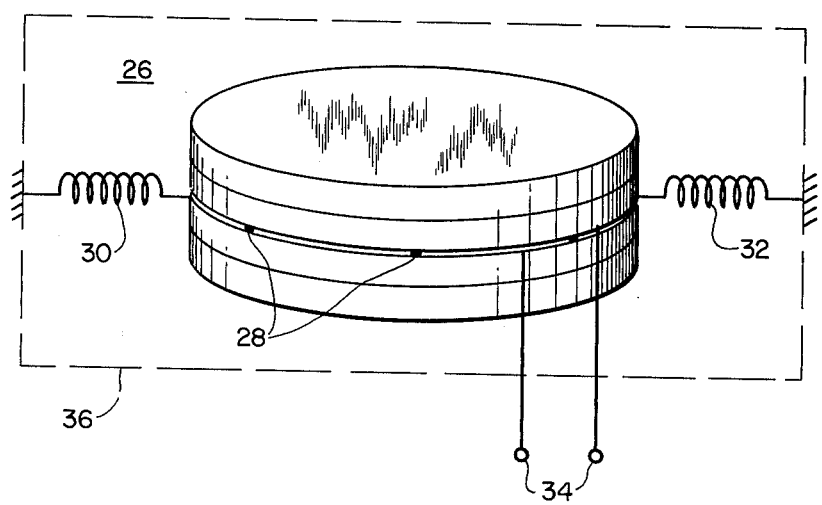
FIG. 2 is a perspective view of an assembled disc shaped bimorph element.

In FIG. 2 there is shown a superimposed assembly 26 of the two disc shaped bimorph elements bonded together along its edge with a non-brittle cement 28 to form the electrically variable capacitor. The assembly is suspended along the boundary edges by means of spring 30 and 32 which serve to reduce the effects of shock and vibrations. As shown, the capacitor electrodes 24 and 27 are connected to an external circuit 34. For example, tunable power oscillators or an automatic antenna matching circuit. The complete assembly 26 is placed in a high vacuum environment 36 to prevent capacitor breakdown at high electric field strength.

In operation, with the drive voltage 29 applied to the superimposed bimorph elements as shown the bimorph elements 10 and 12 will flex at their centers, thereby forming a very shallow cup. Since the bimorph elements are image positioned, the amount of spacing between the centers will provide a measure of capacitance.

It should be understood, of course, that the foregoing disclosure relates to only preferred embodiments of the invention and that numerous modifications or alterations may be made therein without departing from the spirit and the scope of the invention as set forth in the appended claims.

What is claimed is:

1. A variable capacitor comprising:

first and second disc-shaped bimorph elements, each having opposed parallel surfaces;

each said bimorph element having a capacitor electrode mounted on one of said surface;

each said capacitor electrode including a broad section mounted at the center of said one surface and a narrow section extending from said broad section to the periphery of said one surface;

each said bimorph element having a conductor mounted on and extending over said one surface in the same plane as said capacitor electrode and spaced from said capacitor electrode;

a conductor mounted on and extending over the other of said surface of each said bimorph element;

mounting means for connecting the periphery of said bimorph elements to each other with each said one surface superimposed and adjacent;

means for insulating said capacitor electrodes from each other; and each said bimorph element being polarized in a direction such that a voltage will cause said bimorph elements to flex away from each other at the centers thereof.

2. A variable capacitor as in claim 1 and wherein said first and second bimorph elements are mounted in a high vacuum.

* * * * *